(12) United States Patent
McLean et al.

(10) Patent No.: US 6,696,221 B1
(45) Date of Patent: Feb. 24, 2004

(54) PRINTING PLATE AND METHOD OF MAKING USING DIGITAL IMAGING PHOTOPOLYMERIZATION

(75) Inventors: Michael E. McLean, Waynesville, NC (US); Dennis R. Wolters, Dayton, OH (US); Allen Bohnstadt, Mauldin, SC (US)

(73) Assignee: Day International, Inc., Dayton, OH (US)

( * ) Notice: Subject to any disclaimer, the term of this patent is extended or adjusted under 35 U.S.C. 154(b) by 0 days.

(21) Appl. No.: 09/691,999

(22) Filed: Oct. 19, 2000

Related U.S. Application Data

(62) Division of application No. 09/081,465, filed on May 19, 1998, now abandoned.
(60) Provisional application No. 60/047,035, filed on May 19, 1997.

(51) Int. Cl.[7] .............................. G03F 7/00; G03F 7/18; G03F 7/24; G03F 7/30
(52) U.S. Cl. ...................... 430/306; 430/945; 430/329; 264/401
(58) Field of Search ............................ 430/271.1, 306, 430/329, 945; 264/401

(56) References Cited

U.S. PATENT DOCUMENTS

| | | | |
|---|---|---|---|
| 4,116,715 A | * | 9/1978 | Smiggen et al. ............... 134/6 |
| 4,137,081 A | | 1/1979 | Pohl |
| 4,234,676 A | | 11/1980 | Hein et al. |
| 4,323,637 A | * | 4/1982 | Chen et al. ............... 430/271.1 |
| 4,358,354 A | | 11/1982 | Iida et al. |
| 4,415,649 A | | 11/1983 | Munger et al. |
| 4,478,931 A | | 10/1984 | Fickes et al. |
| 4,582,777 A | * | 4/1986 | Fischer et al. ........... 430/271.1 |
| 4,610,950 A | | 9/1986 | Milliken |
| 4,684,600 A | * | 8/1987 | Worns et al. ............ 430/271.1 |
| 4,702,994 A | | 10/1987 | Rendulic et al. |
| 5,015,424 A | | 5/1991 | Smalley |
| 5,104,592 A | | 4/1992 | Hull et al. |
| 5,135,379 A | | 8/1992 | Fudim |
| 5,175,072 A | | 12/1992 | Martens |
| 5,187,044 A | | 2/1993 | Prioleav et al. |
| 5,273,691 A | | 12/1993 | Hull et al. |

(List continued on next page.)

FOREIGN PATENT DOCUMENTS

| | | |
|---|---|---|
| DE | 42 32 187 A1 | 3/1994 |
| EP | 0 491 368 A2 | 6/1992 |
| WO | Wo 91/13511 | 9/1991 |

OTHER PUBLICATIONS

IBM Technical Disclosure Bullentin, vol. 27 No. 108, Dated Mar. 1985, entitled "Laser Direct Imaging System for Printing Band Manufacturing".
Dahl et al. "The FQC Plate Construction Project", FLEXO Nov. 1996, pp. 1–6.
Faber, "Printing in 3–D", Discover, Sep. 1994.
Internet Article, "Rapid Prototyping" at http://www.sandi-a.gov/search.

Primary Examiner—Janet Baxter
Assistant Examiner—Sin J. Lee
(74) Attorney, Agent, or Firm—Dinsmore & Shohl LLP

(57) ABSTRACT

A printing plate is provided including a support assembly and a relief imaged surface formed directly on the surface of the support assembly by digital photopolymerization. The support assembly may be in the form of a cylindrical sleeve or a flat polymeric base. The printing plate is formed by providing a liquid photopolymer on the surface of the support assembly and irradiating the polymer with a source of actinic to form the relief image. The printing plate is reimagable and may be used in flexographic printing processes as well as other printing applications.

20 Claims, 3 Drawing Sheets

U.S. PATENT DOCUMENTS

| | | | |
|---|---|---|---|
| 5,278,027 A | * 1/1994 | Clarke | 430/307 |
| 5,535,674 A | 7/1996 | Vrotacoe et al. | |
| 5,654,125 A | 8/1997 | Fan et al. | |
| 5,700,343 A | 12/1997 | Castelli et al. | |
| 5,725,994 A | * 3/1998 | Kondo | 430/270.1 |
| 5,858,940 A | * 1/1999 | Orcutt | 510/171 |
| 5,888,697 A | * 3/1999 | Fan | 430/273.1 |
| 5,894,799 A | 4/1999 | Bart et al. | |
| 5,994,026 A | * 11/1999 | DeBoer et al. | 430/270.1 |
| 6,048,667 A | * 4/2000 | Eldin et al. | 430/281.1 |

* cited by examiner

PRINTING PLATE AND METHOD OF MAKING USING DIGITAL IMAGING PHOTOPOLYMERIZATION

CROSS REFERENCE TO RELATED APPLICATIONS

This application is a division of U.S. patent application Ser. No. 09/081,465, filed May 19, 1998, now abandoned.

This application claims the benefit of U.S. Provisional Patent Application Serial No. 60/047,035, filed May 19, 1997.

BACKGROUND OF THE INVENTION

The present invention relates to a printing plate and method of making it, and more particularly to such a printing plate having a relief image formed on its surface by digital imaging photopolymerization.

Flexography or flexographic printing are terms which have been applied broadly to a specialized form of relief printing which utilizes rubber or other elastomeric relief plates. Because the inks used for flexography dry very quickly, flexographic printing has been widely used to print a variety of nonabsorbent surfaces including plastics and foils as well as thick substrates such as paperboard. More recent improvements in the quality of the rubbery relief plates used in flexographic printing has broadened the types of jobs which are printed using this technique.

The rubbery relief plates used in flexography have been made in the past by casting or pressing a rubber sheet against a metal negative relief surface and then hardening the rubber. More recently, the plates have been manufactured using photohardenable polymeric compositions. Typically, a sheet of the photohardenable composition is covered with a flexible polymeric film and imagewise exposing the composition through the film using actinic radiation. The polymeric film and unhardened portions of the composition are then stripped away and removed, leaving the imaged relief surface.

However, problems have remained with flexographic printing plates including loss of sharpness in the relief surface caused by the diffraction of the actinic radiation passing through the film layer or mask to the surface of the photohardenable composition and distortion of the rubbery relief surfaces when the plate is mounted onto a plate cylinder for printing. Additionally, as the plates are customized for individual repetitive printing jobs, the printer must maintain a large inventory of the plates typically mounted on a replaceable sleeve, which takes up valuable plant space and increases parts costs to the printer.

Accordingly, needs remain in this art for a printing plate which can be accurately imaged and readily replaced to provide improved print quality while lowering costs to the printer.

SUMMARY OF THE INVENTION

The present invention addresses these needs by providing a printing plate having a relief imaged surface which is reimagable, i.e., the relief image(s) can be removed and new images replaced on the surface. The plate may be utilized in flexographic printing processes. Further, with suitable modifications, the plate may also be useful in other direct and indirect relief printing processes including offset lithography as well as in intaglio processes such as direct and indirect gravure printing processes. The printing plate of the present invention may be provided as either a cylindrical or flat printing plate.

In accordance with one aspect of the invention, a printing plate is provided which comprises a support assembly and a relief-imaged surface on the support assembly. The support assembly may be a composite of one or more layers of metal, fabric, and/or polymer to provide requisite properties of compressibility and conformability as well as a stable support surface for the raised image. The support assembly may take a variety of forms. In one embodiment, the support assembly comprises an expandable, cylindrical sleeve including a base layer, at least one compressible layer, and a surface layer which includes a relief image. The sleeve is replaceable and can be mounted and demounted onto a metal cylinder or roller using pressurized air. The support assembly is constructed to provide an inner diameter and shape which is mountable onto a cylinder or roller without slippage during the printing process. Alternatively, the support assembly may comprise a flat polymeric base layer including the relief imaged surface, which base layer can be used in either a flat configuration, or mounted onto a cylinder for printing.

The relief imaged surface is formed using digital imaging photopolymerization techniques in which a liquid photopolymer layer is provided on the support assembly and is exposed to a light source which emits radiation for a time sufficient to cure and harden the photopolymer in areas exposed to the radiation. The term "photopolymerization" is meant to include both polymer formation and polymer crosslinking and also includes photohardenable compositions. Preferably, a raised relief image of approximately 0.40 to about 1.0 mm is provided. The liquid photopolymer may be any light-sensitive polymer which will cure and harden after exposure to actinic radiation. The photopolymer is preferably selected from the group consisting of acrylates, epoxies, urethanes, and unsaturated polyesters.

In one embodiment of the invention, the relief imaged surface is formed at a digital imaging station using stereolithography techniques. At the imaging station, the support assembly, in the form of a cylindrical sleeve, is immersed into a bath of a liquid photopolymer or meterly coated with liquid polymer in a non-immersive manner. The support assembly is rotated so that successive portions of the support assembly which are covered by the photopolymer are exposed to a source of actinic radiation such as a laser which is translated along or across the surface of the support assembly. Alternatively, the laser may be fixed, and the support assembly translated and rotated appropriately. Those portions of the photopolymer which are exposed to the laser cure and form raised image areas. Laser scanning is repeated until the entire surface is imaged.

The resulting printing plate may then be mounted onto a press and used to print in a conventional manner. Once the particular printing job for which the image was produced has been completed, the imaged sleeve may be demounted and stored for later reuse. Alternatively, the relief image surface may be removed at a reprocessing station, and the surface of the plate prepared for receiving a new image at the digital imaging station. The relief image is preferably removed by an abrading mechanism which mechanically grinds, scrapes, or otherwise cuts away the imaged areas until the surface of the support layer is exposed. Alternatively, the image may be removed by chemically dissolving and washing away the raised image.

Because in a preferred embodiment of the invention, the plate is in the form of a replaceable sleeve, the printer need not tie up a printing cylinder for each plate; the sleeves may be readily demounted and stored. Further, as the image on the printing plate is replaceable, the printer need not maintain a large inventory of plates. This reduces costs. Lastly, as the image is formed digitally from a computer-stored file, there is no degradation in quality of the image as with masks or film layers so that the image which is printed is sharp and well defined.

Accordingly, it is a feature of the present invention to provide a printing plate and process of manufacture having a digitally formed relief imaged surface which may be utilized in flexographic as well as other printing processes. It is a further feature of the invention to provide a reusable printing plate. These, and other features and advantages of the present invention, will become apparent from the following detailed description, the accompanying drawings, and the appended claims.

DETAILED DESCRIPTION OF THE PREFERRED EMBODIMENT

While the printing plate of the present invention will be described with reference to its preferred use as a printing plate for use in a flexographic printing process, it will be apparent to those skilled in the art that the plate may be modified for use in other direct and indirect printing processes including intaglio and direct and indirect gravure processes. Further, while the printing plate will be described as being in the form of a sleeve mounted onto a cylindrical support assembly, it will be apparent that such a sleeve is capable of taking other forms including a flat plate.

Figure 1:
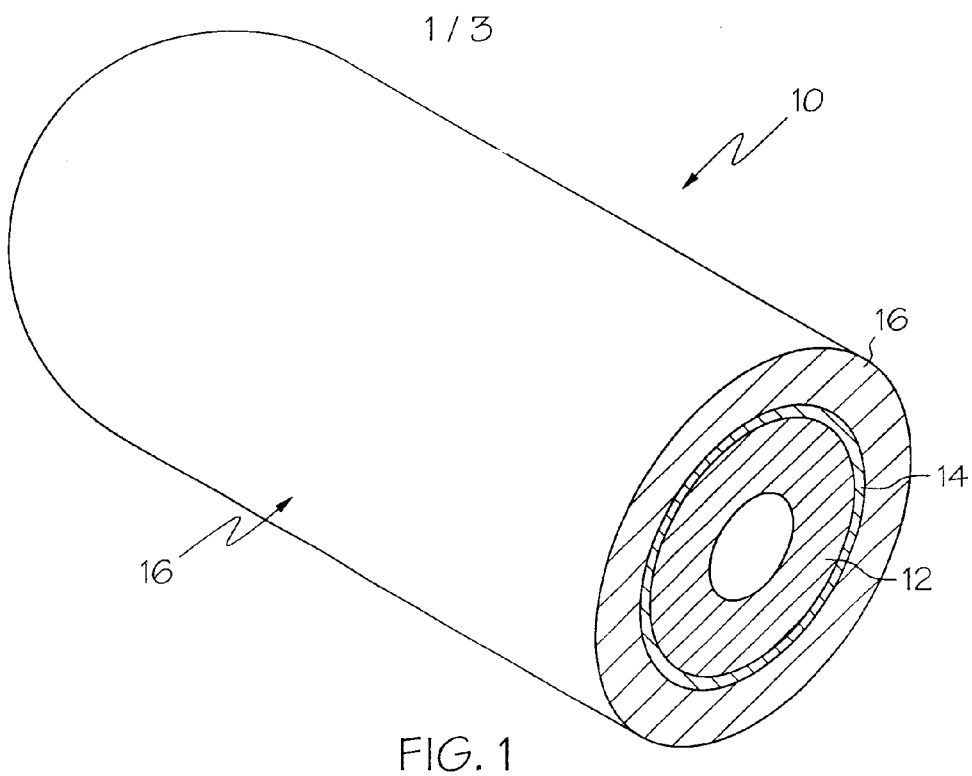
FIG. 1 is a schematic, perspective view of the composite support assembly prior to imaging.

FIG. 1 illustrates one embodiment of the invention in which a schematic of a composite sleeve 10 is shown. The sleeve 10 acts as a support assembly and includes one or more polymer layers including one or more compressible elastomeric layers such as, for example, an inner base polymer layer 12, a compressible layer 14, and a surface layer 16 which provides a stable working surface for the later-applied image-bearing layer. Sleeve 10 is designed to be mounted onto (and demounted from) a cylindrically-shaped roller (not shown) through the use of pressurized air which will cause the sleeve to expand slightly to provide clearance during the mounting and demounting. Once the air pressure is removed, the sleeve 10 will contract tightly about the cylinder and will not slip or slide during printing.

Figure 2:
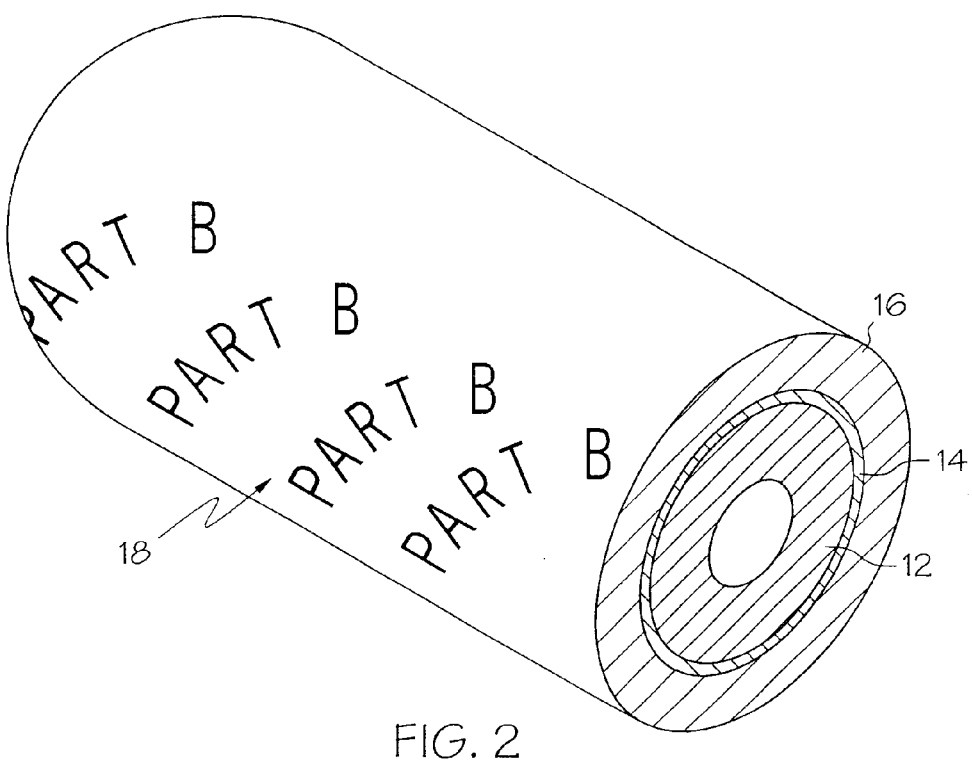
FIG. 2 is a schematic, perspective view of the printing sleeve after imaging.

FIG. 2 shows schematically the printing sleeve 10 after an image ("PART B") has been applied to surface 18. The image may take the form of any indicia including numbers, letters, graphics, etc. needed to perform the print job. Generally, for flexographic applications, the image on surface 18 will have a height of approximately 0.40 to about 1.0 mm.

Figure 3:
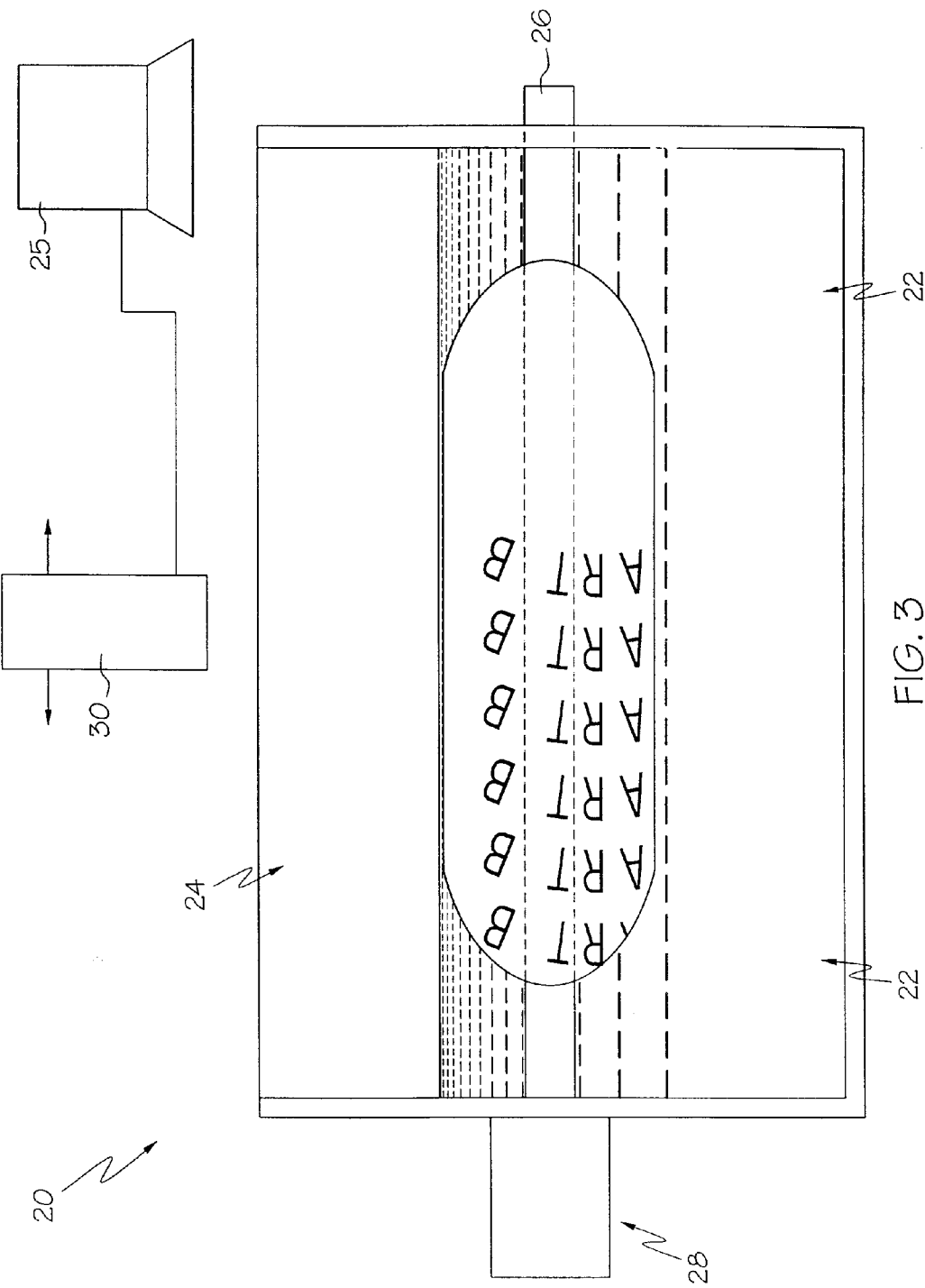
FIG. 3 is a schematic diagram of a preferred imaging process for the printing sleeve at a digital imaging station.

The image is formed on sleeve 10 at a digital imaging station 20 as shown schematically in FIG. 3. There, sleeve 10 is immersed into a bath of a liquid, photopolymer 22 contained in tank 24. Suitable photopolymers are known and are commercially available from a number of companies. Any suitable photocurable or photohardenable resin may be used in the practice of this invention.

As shown, sleeve 10 may be mounted onto a mandrel 26, the long axis of which is rotated by a suitable drive mechanism such as, for example, a stepper motor 28. The level of liquid photopolymer in the bath is such that the upper surface of the sleeve is substantially level with the upper surface of the polymer bath. Actinic radiation to activate and harden the polymer is provided from a source 30 which is preferably a laser light source. However, it will be appreciated that other sources of actinic radiation may be utilized within the scope of the present invention.

Laser 30 is mounted so that it can be translated to irradiate parallel to the long axis of sleeve 10. The beam is modulated under the control of a computer 25 to create a single line of the image to be formed. Computer aided design and, drafting software is commercially available from a number of companies and may be used to convert a desired image to be printed into the necessary modulation of the laser beam. After each line of the image is scanned onto the surface of sleeve 10, stepper motor 28 rotates sleeve 10 to position it to receive the next line of information. In this manner, a relief image is built up on surface 18 of the sleeve. Once imaging has been completed, sleeve 10 is removed from the bath, and any excess, unreacted photopolymer is washed away. For extended use, the finished plate may be baked to increase its durability.

Upon finishing image sleeve 10 as is conventional in flexographic applications, the sleeve may then be mounted onto a plate cylinder of a flexographic printing press. Because the image is digitally formed directly onto the cylindrical surface of the sleeve 10, there is no distortion of the image, which remains sharp and well defined. Once a printing job has been completed, sleeve 10 may be demounted and stored for later use (if the print job is repetitive).

Figure 4:
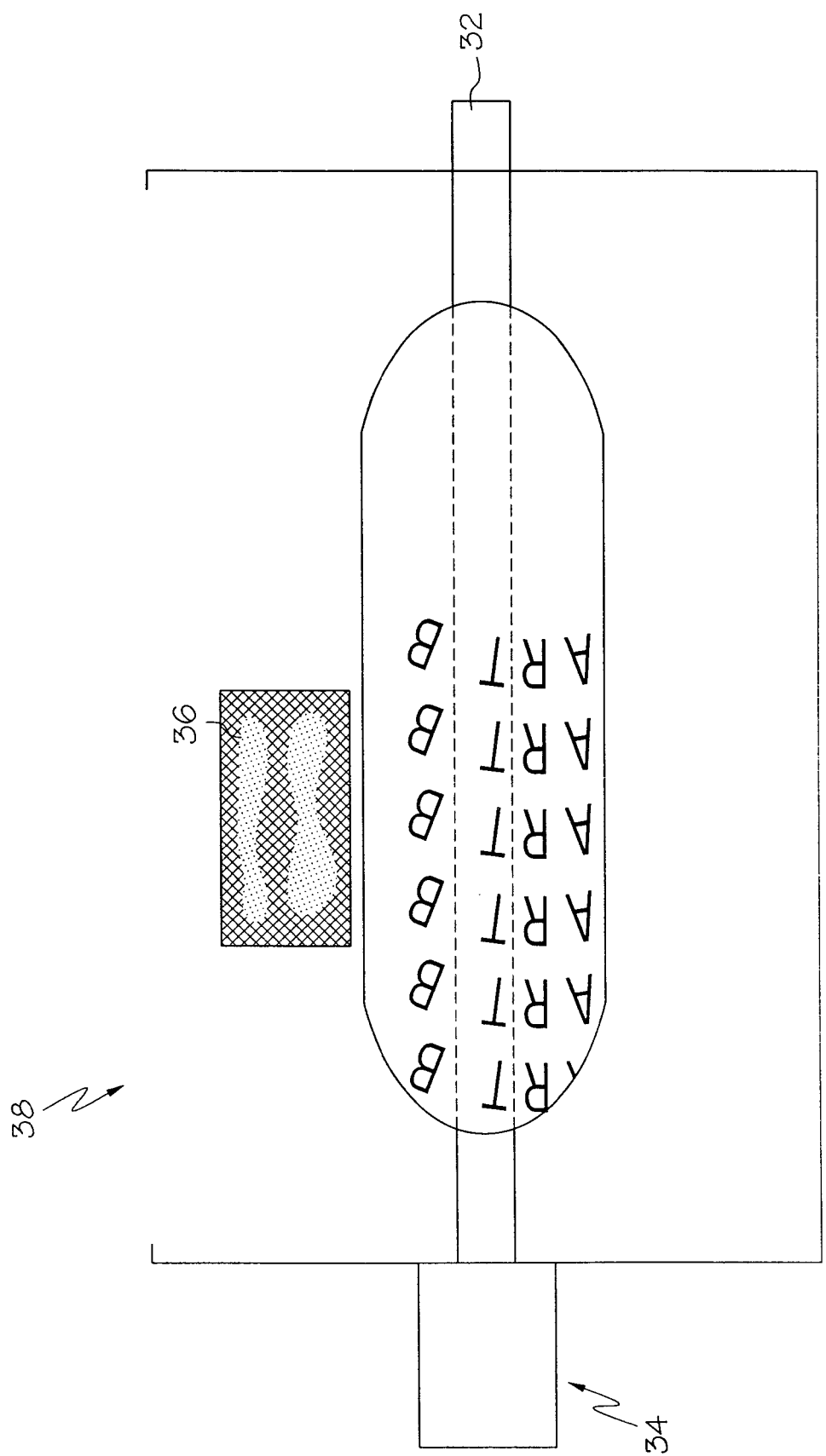
FIG. 4 is a schematic diagram of the removal of the image portion of the printing sleeve at a sleeve reprocessing station.

Alternatively, the image on surface 18 may be removed at reprocessing station 38 and sleeve 10 reused as shown in FIG. 4. There, sleeve 10 is mounted onto another mandrel 32 and rotated about its long axis by a suitable drive mechanism 34. The imaged surface 18 is removed by a suitable polymer abrading mechanism 36 which mechanically grinds, scrapes, or cuts away the image until surface layer 16 on sleeve 10 is exposed. Alternatively, the image may be removed by chemically dissolving and washing away the raised image. The reprocessed sleeve may then be taken back to digital imaging station 20 where a new image is built up as previously described.

Because the images for each printing job may be stored in computer memory, the printer need not stock in inventory multiple printing sleeves or plates. Rather, each printing job may be created and the same sleeve imaged over and over again. This permits the printer to stock only a minimum number of sleeves, reducing both storage and materials costs. Furthermore, because each print job is digitally imaged directly on the printing sleeve, the print quality is high.

While certain representative embodiments and details have been shown for purposes of illustrating the invention, it will be apparent to those skilled in the art that various changes in the methods and apparatus disclosed herein may be made without departing from the scope of the invention.

What is claimed is:

1. A method of making a printing plate comprising:
providing a support assembly comprising an expandable sleeve including a base layer, a surface layer, and at least one compressible layer positioned between said base layer and said surface layer;

providing a liquid photopolymer on at least a portion of the surface of said support assembly; and irradiating said liquid photopolymer without a mask with a light source for a time sufficient to cure said liquid photopolymer and form a relief image directly on said support assembly.

2. A method as claimed in claim 1 in which said support assembly is immersed into a bath of said liquid photopolymer.

3. A method as claimed in claim 1 in which said support assembly is meterly coated with said liquid photopolymer.

4. A method as claimed in claim 1 wherein said irradiating comprises raster imaging of said liquid photopolymer.

5. A method as claimed in claim 1 wherein said light source is a laser, and said method further comprises rotating said support assembly and controlling said laser with a computer to stepwise image said liquid photopolymer.

6. A method as claimed in claim 1 in which said liquid photopolymer is prepared from the group consisting of acrylates, epoxies, urethanes, unsaturated polyesters, and mixtures thereof.

7. The method of claim 1 in which said support assembly comprises a polymeric base layer.

8. A method as claimed in claim 1 in which said light source comprises a laser.

9. A method as claimed in claim 1 in which said light source is translated over said surface of said support assembly to photopolymerize selected portions of said liquid photopolymer.

10. A method as claimed in claim 1 further including the step of removing said relief image from the surface of said support assembly.

11. The method as claimed in claim 10 in which said relief image is removed by an abrading mechanism.

12. The method as claimed in claim 10 in which said relief image is removed by chemically dissolving said relief image.

13. A method of making a printing plate comprising:

providing a support assembly comprising an expandable sleeve including a base layer, a surface layer, and at least one compressible layer positioned between said base layer and said surface layer;

providing a liquid photopolymer on at least a portion of the surface of said support assembly;

rotating said support assembly;

irradiating said liquid photopolymer without a mask with a light source for a time sufficient to cure said liquid photopolymer and form a relief image directly on said support assembly; and controlling translation and duration of said light source with a computer to stepwise image said liquid photopolymer.

14. A method as claimed in claim 13 in which said liquid photopolymer is prepared from the group consisting of acrylates, epoxies, urethanes, unsaturated polyesters, and mixtures thereof.

15. A method as claimed in claim 13 in which said support assembly is immersed into a bath of said liquid photopolymer.

16. A method as claimed in claim 13 in which said support assembly is meterly coated with said liquid photopolymer.

17. The method of claim 13 in which said support assembly comprises a polymeric base layer.

18. A method as claimed in claim 13 in which said light source comprises a laser.

19. A method as claimed in claim 13 further including the step of removing said relief image from the surface of said support assembly.

20. A method as claimed in claim 13 wherein said irradiating comprises raster imaging of said liquid photopolymer.

* * * * *